United States Patent [19]
Martinez et al.

[11] Patent Number: 5,541,533
[45] Date of Patent: Jul. 30, 1996

[54] OUTPUT CIRCUIT FOR AN TTL-CMOS INTEGRATED CIRCUIT

[75] Inventors: Raymond Martinez, Orvault; Thierry Bion, Nantes, both of France

[73] Assignee: Matra MHS, Nantes, France

[21] Appl. No.: 432,926

[22] Filed: May 1, 1995

[30]  Foreign Application Priority Data

May 3, 1994 [FR] France ................................. 94 05387

[51] Int. Cl.$^6$ ............................................. H03K 19/0175
[52] U.S. Cl. ................................. 326/71; 326/58; 326/27
[58] Field of Search .............................. 326/70–71, 121, 326/58, 27

[56]  References Cited

U.S. PATENT DOCUMENTS

| | | | |
|---|---|---|---|
| 4,728,822 | 3/1988 | Kusaka | 326/71 |
| 5,140,195 | 8/1892 | Wakayama | 326/121 |
| 5,216,299 | 6/1993 | Wanless | 326/71 |
| 5,418,477 | 5/1995 | Dhong | 326/71 |

FOREIGN PATENT DOCUMENTS 2614743  4/1987  France .

OTHER PUBLICATIONS

Patent Abstracts of Japan, vol. 14, No. 336, 19 Jul. 1990, & JP-A-02 113 721 (Mitsubishi Electric Corp.).

*Primary Examiner*—Edward P. Westin
*Assistant Examiner*—Andrew Sanders
*Attorney, Agent, or Firm*—Larson and Taylor

[57]  ABSTRACT

An output circuit for a TTL-CMOS integrated circuit that comprises an output stage with two P MOS and N MOS transistors in parallel, which are connected in cascade with an N MOS enabling transistor between the power supply and the reference voltages. The output stage connected by means of a validation signal TRISB and of P and N MOS transistors delivers an output signal representing the input logic variable to the common point between the P MOS transistor and enabling transistor. A first circuit allows switching of the P MOS transistor by an intermediate switching control signal TRISP and a third circuit allows switching of the N MOS transistor, the circuit operating in mode of feedback of the switching control of the P MOS transistor, the controls being applied successively in order to generate an intermediate switching level belonging to the high logic level.

4 Claims, 3 Drawing Sheets

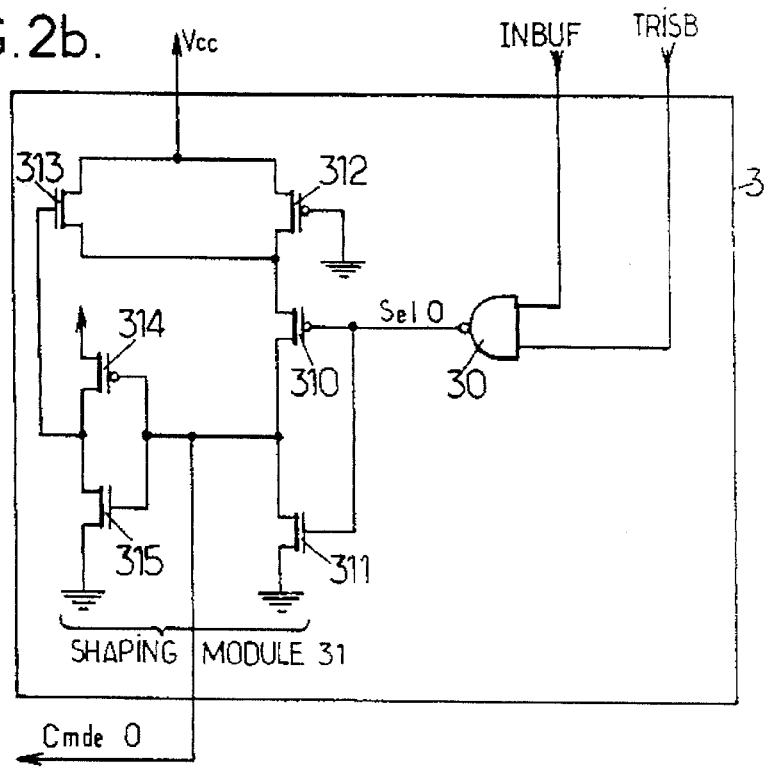
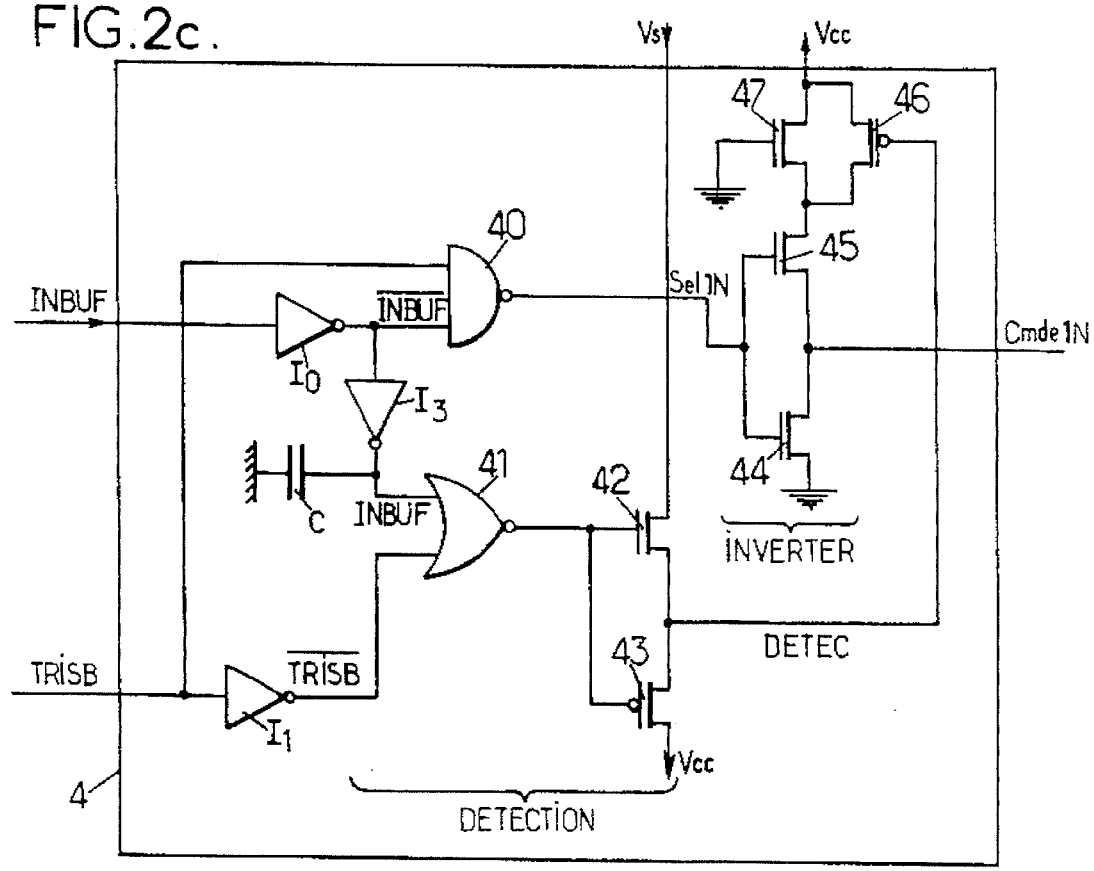

OUTPUT CIRCUIT FOR AN TTL-CMOS INTEGRATED CIRCUIT

BACKGROUND OF THE INVENTION

1. Field of the Invention

The invention relates to an output circuit for an integrated circuit, of TTL-CMOS type.

2. Description of Related Art Including Information Disclosed Under 37 C.F.R. §1.97–1.99.

In the technology of integrated circuits of the TTL-CMOS type, the digital-type input-output signals have to exhibit a high logic level and a low logic level each corresponding to an electrical voltage value, each recognized as such. More specifically, each of the abovementioned electrical voltages has to lie within a range of electrical voltage values, which are each recognized as corresponding to the logic level in question.

With the advent of the most recent integrated circuits, the abovementioned ranges of values have been subject to a redefinition. In TTL technology, the high logic level corresponds to an electrical voltage greater than 1.5 volts, the low logic level corresponding to an electrical voltage lying between 1.5 volts and the reference voltage, the earth voltage of the circuit. In CMOS technology, the high logic level corresponds to a voltage greater than or equal to 2.4 volts and the low logic level to a voltage lying between 0.4 volts and the reference voltage.

On top of the major interest in a potential reduction in the consumption of electrical energy such integrated circuits, consequent on the reduction in the amplitude of switching between the abovementioned logic levels, the average consumption being reduced correspondingly, these circuits are capable of allowing shorter switching times, and thus the implementation of faster circuits, provided that the electrical voltages defining the abovementioned high and low logic levels correspond to voltage values close to the limit values of the ranges of values for defining the TTL-CMOS levels, respectively above and below them, which makes it possible consequently to reduce the time for switching from one to the other of the levels.

SUMMARY OF THE INVENTION

The subject of the present invention is the implementation of an output circuit for an integrated circuit of TTL-CMOS type, making it possible to reduce the time for switching between high logic level and low logic level and vice versa, which makes it possible consequently to increase the speed of switching between the abovementioned levels.

Furthermore, an object of the present invention is also, by virtue of the reduction in the amplitude of switching between high logic level and low logic level, and vice versa, consequently to reduce the level of switching noise generated.

The output circuit for an integrated circuit of TTL-CMOS type, which is the subject of the present invention, comprises an input circuit for a logic variable at a high level and at a low level respectively.

It is noteworthy in that it comprises an output stage formed by a P-type MOS transistor and an N-type MOS transistor in parallel, which are connected in cascade with an N-type MOS transistor between the power supply voltage and the reference voltage, this output stage possibly being connected or not connected by means of the abovementioned transistors and of switching enable signals, and delivering an output signal at an output point of this output stage, a common point between the N transistor and the MOS transistors in parallel.

A first switching control circuit for the P-type MOS transistor is provided, this circuit being connected to the input circuit for a logic variable and receiving a signal representative of the logic variable and a first switching enable signal. A second switching control circuit for the N-type MOS transistor is provided, this circuit operating in feedback on the output signal of the output stage. The first and the second switching control circuit are driven successively so as to generate an intermediate switching level belonging to the high logic level, which makes it possible to enhance the resultant time for switching between levels.

The invention finds an application to the fabrication of integrated circuits in sub-micronic CMOS technology in order to obtain high-speed circuits the switching time of which lies between 4 and 6 nanoseconds.

BRIEF DESCRIPTION OF THE DRAWINGS

It will be better understood on reading the description and on perusing the drawings below in which:

FIG. 2b represents a second control circuit for the N-type MOS transistor in cascade with the P and NMOS transistors in parallel, implemented in the output circuit for an integrated circuit as represented in FIG. 1;

FIG. 2c represents an advantageous embodiment of a third control circuit for the N-type MOS transistor, in parallel with the P-type MOS transistor, included in the output stage of the output circuit for an integrated circuit as represented in FIG. 1;

DESCRIPTION OF THE PREFERRED EMBODIMENTS

A more detailed description of an output circuit for an integrated circuit of TTL-CMOS type which is the subject of the present invention, will now be given in connection with FIG. 1.

In a general way, it is pointed out that the output circuit for an integrated circuit which is the subject of the present invention is compatible with the signal standards in TTL technology and in CMOS technology respectively, the signals thus delivered by the output circuit for an integrated circuit being recognized as high logic level and low logic level respectively for any circuit connected to the output of the output circuit for an integrated circuit which is the subject of the present invention, of TTL type or of CMOS type, the output signals thus delivered by the output circuit for an integrated circuit which is the subject of the present invention certainly satisfying both the TTL standard and the CMOS standard mentioned previously in the description.

Figure 1:
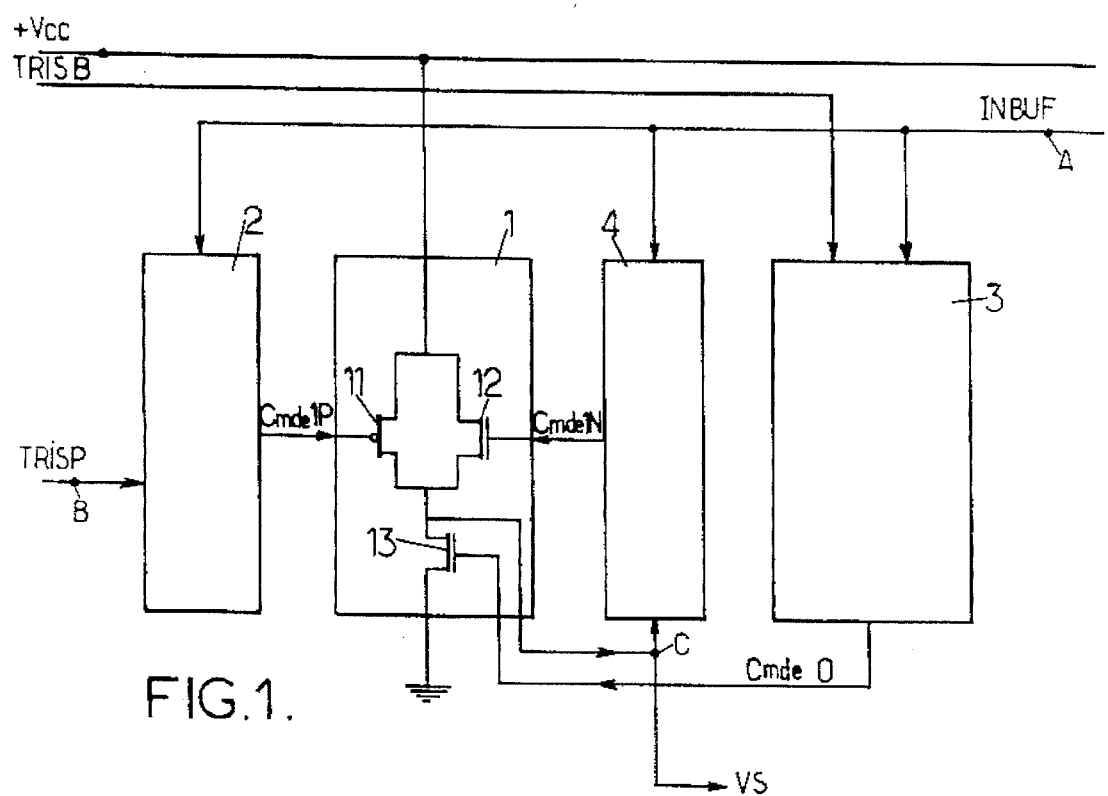
FIG. 1 represents a functional diagram of the output circuit for an integrated circuit which is the subject of the present invention.

As will be observed in FIG. 1, it is pointed out that the output circuit for an integrated circuit, which is the subject of the present invention, comprises an input circuit for a logic variable at a high level and at a low level respectively.

This input circuit corresponds to test point A in FIG. 1, the signal representative of the abovementioned logic variable being denoted INBUF. It is understood, obviously, that this input signal may be delivered by an integrated circuit incorporating the output circuit which is the subject of the present invention. In particular, this integrated circuit may be equipped with modules for memory storage of the abovementioned logic variable, this memory storage circuit possibly consisting of a buffer memory, not represented in FIG. 1.

As will be observed in the abovementioned figure, the output circuit of an integrated circuit which is the subject of the invention comprises an output stage, denoted 1, formed by a P-type MOS transistor, denoted 11, and an N-type MOS transistor, denoted 12, which are connected in parallel, the assembly of the two abovementioned transistors in parallel being connected in cascade with an N-type MOS transistor, this transistor being denoted 13, the transistors in parallel 11, 12 and the transistor in cascade 13 with the two abovementioned transistors being connected between the power supply voltage, denoted VCC, and the reference voltage constituting the earth voltage of the output circuit and, obviously, of the integrated circuit incorporating it.

The output stage 1, in accordance with one particularly advantageous aspect of the output circuit which is the subject of the present invention may be connected or not connected by means of transistors 11, 12 and 13 and of a first switching enable signal, denoted TRISP, the output stage 1 delivering an output signal Vs at an output point consisting of the common point between the N-type MOS transistor, denoted 13, and the P-type and N-type respectively MOS transistors 11, 12, connected in parallel.

Moreover, the output circuit which is the subject of the invention comprises a first switching control circuit for the P-type MOS transistor, denoted 11, this first control circuit bearing the reference 2 in FIG. 1. The first switching control circuit 2 is connected to the input circuit for the logic variable and thus receives the signal representing this logic variable INBUF as well as the first switching enable signal, denoted TRISP.

In FIG. 1, it is pointed out that the test points A, B, C correspond respectively to an input point of the signal representing the logic variable INBUF, to the first switching enable signal TRISP, and to the output signal, denoted Vs, respectively, at the output point of the output stage 1.

Moreover, as has been represented in FIG. 1, the output circuit which is the subject of the present invention comprises a second control circuit 3 for the N-type MOS transistor, denoted 13, this control circuit 3 receiving, on the one hand, the first previously mentioned switching enable signal TRISP and, obviously, the signal representing the logic variable INBUF, and delivering a control signal for the NMOS transistor 13, this control signal bearing the reference Cmde0. The control signal for the transistor 13 makes it possible, by virtue of turning on the N-type MOS transistor, to set the value of the output voltage Vs to a value very close to the reference voltage, that is to say in fact, to impose the value 0 on the low logic level for the output signal Vs when the transistor 13 is in the conducting state, as will be described in more detail later in the description.

Finally, the output circuit which is the subject of the present invention also comprises a third switching control circuit for the N-type MOS transistor 12, connected in parallel with the P-type MOS transistor 11 of the output stage 1, this third control circuit, denoted 4, operating in feedback on the output signal of the output stage, as will be described below in the description.

In a general way, it is pointed out that the first and third switching control circuits 2 and 4 are driven successively from the transition from a high logic level to a low logic level, and vice versa, as far as the second circuit for control of switching 3 from a low logic level to a high logic level of the signal representing the logic variable INBUF is concerned, as will be described below in the description.

This control mode makes it possible to generate an intermediate switching level belonging to the high logic level, which makes it possible to enhance the resultant time for switching between levels when passing from the high logic level to the low logic level, as will be described below.

A more detailed description of the first switching control circuit 2 will now be given in connection with FIG. 2a.

Figure 2A:
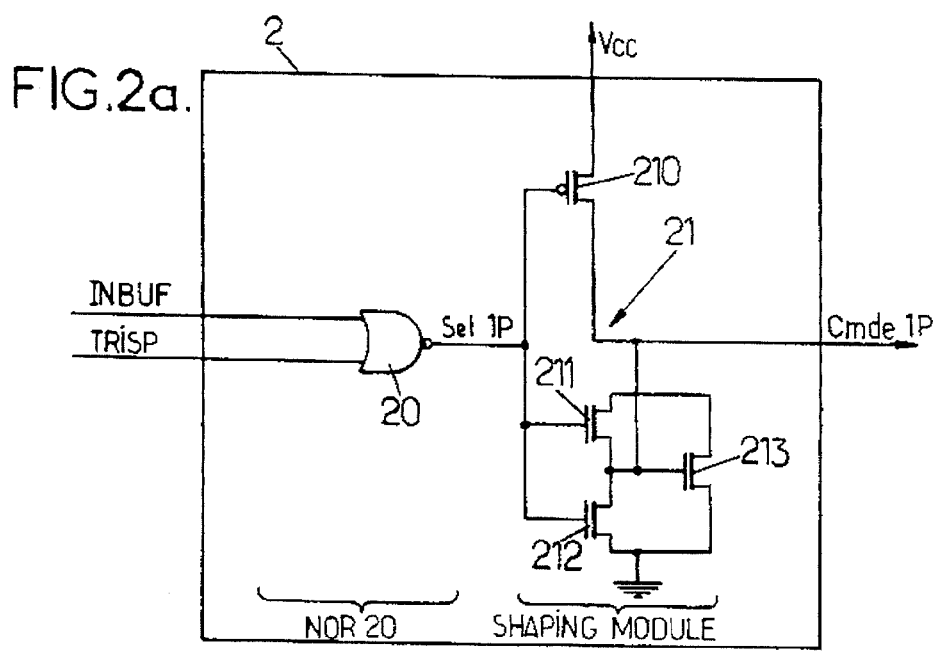
FIG. 2a represents an advantageous embodiment of the first control circuit for the P-type MOS transistor included in the output stage of the output circuit for an integrated circuit as represented in FIG. 1.

According to the abovementioned figure, it is pointed out that the first switching control circuit 2 includes, connected in cascade, a NOR-type circuit, denoted 20, receiving on its switching control inputs the signal representing the logic variable INBUF and the first switching enable signal, denoted TRISP, so as to deliver an intermediate switching pre-control signal, denoted sel1P in the abovementioned FIG. 2a.

The first switching control circuit 2 also includes a circuit 21 for shaping the intermediate switching pre-control signal sel1P, the shaping circuit 21 receiving the abovementioned signal sel1P and delivering a positive intermediate switching control signal, denoted cmde 1P, to the gate electrode of the P-type MOS transistor 11 of the output stage 1. It is pointed out that the positive intermediate switching control signal designation is given by reference to the control of the P-type MOS transistor and not relative to the actual polarity of the control signal in question.

The shaping circuit 21 is formed by an inverted structure receiving the intermediate pre-control signal sel1P. It comprises three N-type transistors 211, 212, 213, the transistors 211, 212 being connected in cascade, their gate being driven in parallel by the signal sel1P, the transistor 213 being connected in parallel with the cascade formed by the transistors 211, 212, the gate of the transistor 213 being linked to the common point of the transistors 211 and 212. A P-type MOS transistor 210, the gate of which is connected to the output of the NOR gate 20, receiving the signal sel1P, is connected between the power supply voltage VCC and the common point of the MOS transistors 211 and 212, and delivers the positive intermediate switching control signal cmde1P. The speed of high logic level—low logic level switching at the output of the shaping circuit 21 is self-regulated by virtue of the three N-type transistors 211, 212 and 213. During the first switching phase, the signal cmde1P is in the high logic level state, the three abovementioned transistors being in the conducting state. This is the phase, called "high-speed" phase, of switching of the cmde1P signal. When this signal reaches the conduction threshold voltage, the transistor 213 turns off, only the transistor 214 remaining in the conducting state. This is the phase called "slow" phase of switching of the cmde1P signal.

It is pointed out that the NOR-type circuit 20 may be produced in CMOS technology by the use of integrated transistors, the diagram possibly corresponding to a conventional NOR-type gate, which, that being so, will not be described in detail.

A more detailed description of the second control device 3 for the N-type transistor 13 will now be given in connection with FIG. 2b.

The second control circuit for the abovementioned transistor, as represented in the abovementioned figure, comprises a NAND-type gate, referenced 30, receiving on its inputs the signal representing the logic variable INBUF and the second switching enable signal TRISB. The NAND-type gate 30 delivers a corresponding signal designated by Se10.

Moreover, the control circuit for the N transistor 13 also comprises a shaping circuit, denoted 31, consisting of an inverter-type structure. This inverter-type structure, as represented in the abovementioned FIG. 2b, comprises two P-type MOS transistors connected in cascade with an N-type MOS transistor between the power supply voltage VCC and the reference voltage, the two P-type MOS transistors bearing the reference 312 and 310 and the N-type MOS transistor bearing the reference 311. The P-type and the N-type MOS transistors 310 and 311 receive the signal se10 on their gate electrode, delivered by the NAND-type gate 30.

The inverting and shaping structure 31 further comprises an N-type MOS transistor 313 connected in parallel with the P-type MOS transistor 312 and an inverter stage proper, formed by a P-type MOS transistor 314 and an N-type MOS transistor 315 connected in cascade and the gate electrodes of which are driven in parallel by the common point between the P-type and N-type MOS transistors 310 and 311. The inverter stage proper formed by the P-type and N-type MOS transistors 314 and 315 is connected between the power supply voltage VCC and the reference voltage, the common point between the transistors 314 and 315 being linked to the gate electrode of the N-type MOS transistor 313. The common point between the P-type and N-type MOS transistors 310 and 311 forms the output point of the control circuit for the N transistor 13, this output point delivering the signal, denoted cmde0, which is delivered to the gate electrode of the N transistor 13. This signal is therefore generated by the inverting structure represented in FIG. 2b. The speed of switching between the low logic level and the high logic level at the output of the abovementioned inverting structure is self-regulated by virtue of the inverter formed by the transistors 315 and 314 of the inverter stage proper as well as by virtue of the N-type and P-type MOS transistors 313 and 312 mounted in parallel. During the first phase of switching, the signal cmde0 delivered by the control circuit 3 for the N transistor 13 is at the low logic level, the N-type and P-type MOS transistors 313 and 312 being in the conducting state, this state corresponding to the phase known as "rapid" phase of the control signal for the N transistor 13, the signal cmde0. When the abovementioned signal reaches the conduction threshold value, the N-type MOS transistor 313 turns off via the inverter stage proper formed by the P-type MOS transistors 314 and by the NMOS transistor 315. The P-type MOS transistor 312 is then alone conducting, which corresponds to a so-called "slow" phase of switching of the control signal for the N transistor 13, the signal cmde0.

As mentioned previously in the description, it is pointed out that the N transistor 13 makes it possible, on the one hand, by switching, to contribute to placing the output stage 1 in and out of circuit on the basis of the second switching enable signal, denoted TRISB, as well as, for the output point and definitely for the output signal Vs, to set the value of the zero, that is to say of the low logic level of this output signal to the reference voltage, to within the saturation voltage of the abovementioned transistor 13.

As far as the third switching control circuit for the N-type MOS transistor 12 is concerned, this circuit bearing the reference 4 makes it possible to operate in output voltage Vs feedback mode, as mentioned previously in the description.

A more detailed description of the third control circuit 4 will now be given in connection with FIG. 20.

As represented in the abovementioned figure, the third switching control circuit for the N-type MOS transistor 12 comprises a NAND logic type circuit 40 receiving on its inputs, on the one hand, the second previously described switching enable signal TRISB, allowing switching control for the N transistor 13 and, on the other hand, the complemented signal representing the logic variable, this signal being denoted INBUF. It is pointed out by way of example that this signal may be obtained from the signal representing the logic variable INBUF by means of an inverter denoted I0. The NAND-type logic circuit 40 delivers a corresponding signal, denoted sellN, from the abovementioned signals.

The third switching control circuit 4 for the N-type MOS transistor also includes a stage for detecting the output voltage Vs delivered by the output stage 1, this detection stage consisting, as represented in FIG. 2c, of a NOR-type logic gate 41, which, on its switching inputs, receives the signal representing the logic variable INBUF and the complemented switching enable signal, denoted TRISB, this signal being obtained from the switching enable signal TRISB by means of an inverter I1. The NOR-type logic circuit 41 delivers a corresponding signal at its output. Specifically, it is pointed out that the INBUF signal representing the logic variable at the input of the NOR-type logic gate 41 is obtained from the corresponding complemented signal delivered by the first inverter I0 by means of a third inverter denoted I3, which makes it possible to restore the signal representing the logic variable INBUF unchanged but delayed by the double switching time of each inverter I0 and I3.

Moreover, the detection stage comprises an inverter-type circuit formed by two MOS transistors connected in cascade, an N-type MOS transistor 42 and a P-type MOS transistor 43, which are connected between the output of the output stage 1, in that way receiving the output voltage Vs, and the reference voltage, the gate of the N-type and P-type MOS transistors 42 and 43 being fed in parallel by the output of the NOR gate 41. The common point of the N-type and P MOS transistors 42 and 43 forming the abovementioned inverter circuit thus makes it possible to deliver a detected signal, denoted detec, which is representative of the detection of the output voltage Vs.

The third switching control circuit 4 finally includes an inverter-type structure making it possible to generate the switching control signal for the N-type MOS transistor 12, this signal being denoted cmde1N. The control signal for the NMOS transistor 12 is called negative intermediate switching control signal by reference to the type of conduction of MOS transistor 12. This inverter-type structure, as represented in FIG. 2c, comprises an inverter proper formed by two N-type and P-type MOS transistors 44 and 45 connected in cascade, the gate of the N and P MOS transistors 44 and 45 being connected in parallel and receiving the signal sellN delivered by the NAND gate 40. The abovementioned output inverter stage is connected furthermore in cascade with a switching stage formed by two MOS transistors in parallel, P MOS transistor 46 and NMOS transistor 47, which are connected between the power supply voltage VCC and the P-type MOS transistor 45 forming an output inverter stage with the NMOS transistor 44. The gate electrode of the NMOS transistor 47 is linked to the reference voltage and the gate electrode of the P MOS transistor 46 is linked to the common point of the P and NMOS transistors 43 and 42 of the inverter circuit of the detection stage, the gate electrode of the P MOS transistor 46 thus receiving the detected signal, a signal denoted detec. The common point of the N and P MOS transistors 44 and 45 of the output inverter circuit delivers the switching control signal for the N MOS transistor 12, signal denoted cmde1N.

The speed of switching from the low logic state to the high logic state at the output of the inverting structure, and more particularly of the output inverter circuit formed by the N and P MOS transistors 44 and 45 is adjustable by means of the detected signal detec, this signal being able to take up two states, either the state of the output signal Vs, this state being conferred on the detected signal detec by means of the NMOS transistor 42, or the state of the value of the power supply voltage VCC via the P MOS transistor 43 when this transistor is turned on. Control of the P and N transistors 43 and 42 is exercised by the signal delivered by the NOR gate 41. When the signal representing the logic variable INBUF passes from the high logic level to the low logic level, the corresponding transition at the input of the NOR gate 41 is delayed by the two inverters I0 and I3 and, if appropriate, by a capacitor denoted C, which, by way of non-limiting example, can be formed by a MOS transistor mounted as a capacitor for example. The output signal delivered by the NOR gate 41 for that reason remains at the low logic level and causes the P MOS transistor 43 to conduct, which keeps the detection signal detec at the value of the power supply voltage VCC. The P MOS transistor 46 is then turned on, the NMOS transistor 42 being in the turned-off state whereas the NMOS transistor 47 is itself in the conducting state. The abovementioned state corresponds to a first phase called "rapid" phase of the switching control signal for the NMOS transistor 12, i.e. of the signal cmde1N.

At the end of a delay time determined by the inverters I0 and I3 and by the capacitor C, the low logic level of the signal representing the logic variable INBUF appears on the input of the NOR gate 41, which causes the output signal delivered by the latter to change over to the high logic level. The P MOS transistor 43 becomes conducting, thus bringing the detected signal detec to the value of the output signal Vs. Following the abovementioned switching, the output signal Vs is lower than the conduction threshold of the NMOS transistor 46, which passes from the conduction state to the off state. The P MOS transistor 47 is then alone conducting, this state corresponding to a second phase called "slow" phase of the switching control signal for the NMOS transistor 12, a signal denoted cmde1N.

In step with the change in the output signal Vs towards the high logic level, the switching detection signal for the P-type MOS transistor 11, a signal denoted detec, changes in the same way via the NMOS transistor 42, which is turned off, and thus reaches the level of conduction of the NMOS transistor 46, which is reset to conducting in a similar way to the first phase called "rapid" phase, this new phase constituting a third phase called "rapid" phase of the control signal cmde1N.

It is pointed out in a general way that the output signal Vs delivered by the output stage 1, represents the inverse or complemented signal of the signal representing the logic variable INBUF when the output stage 1 is connected.

In the same way, the second switching enable signal TRISB in fact constitutes a deactivation signal suppressing the transfer of the signal representing the logic variable INBUF onto the output signal Vs.

Finally it is pointed out that the first switching enable signal TRISP in fact constitutes a signal for deactivation of the P MOS transistor 11 of the output stage 1 connected between the power supply voltage VCC and the output point delivering the output signal Vs. The output signal Vs is active when the signal TRISB is active or just before the signal representing the logic variable INBUF upon two consecutive transfers is established.

Figure 3:
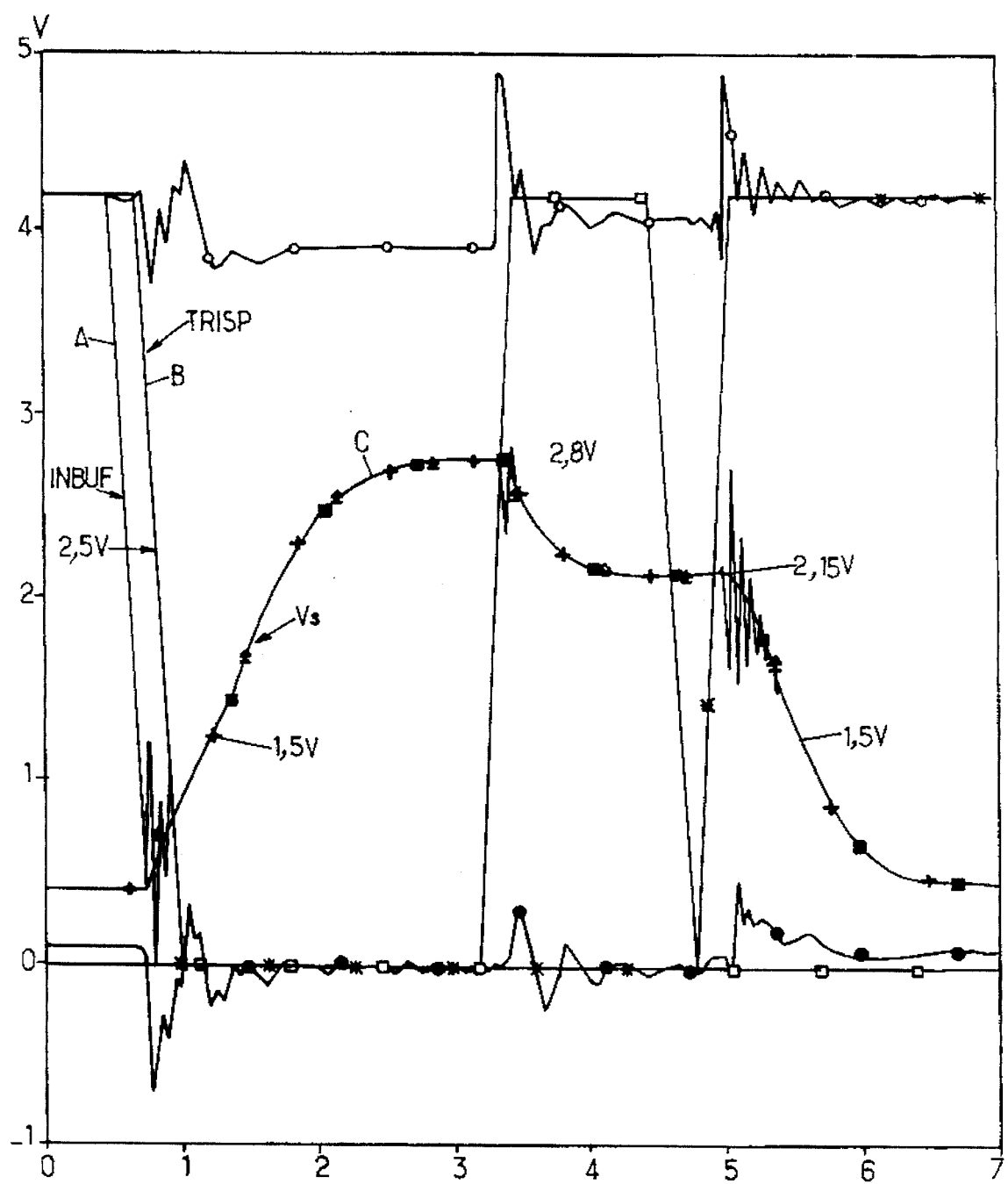
FIG. 3 represents a set of timing diagrams sampled at the test points of FIG. 1.

A representation of the timing diagrams obtained at the test points A, B, C of FIG. 1 is given in FIG. 3, the signal Vs sampled at test point C clearly showing the switching level called "intermediate" level under the control of the signal TRISP sampled at test point B.

An output circuit has thus been described for an integrated circuit of TTL-CMOS type which is particularly advantageous to the extent that this circuit, by introducing a switching level which is intermediate between the high logic level and the low logic level makes it possible, on the one hand, to reduce the switching time and, on the other hand, to reduce the overall noise level of the output stage, which makes it possible to enhance the operating conditions of the latter.

We claim:

1. An output circuit for an integrated TTL-CMOS circuit, said integrated TTL-CMOS circuit comprising an input circuit for producing a logic level variable between a high level and a low level, respectively, and said output circuit comprising:

an output stage formed by a P-type MOS transistor and a first N-type MOS transistor connected in parallel, which are connected in series with an enabling transistor comprising a further N-type MOS transistor, between a power supply voltage and a reference voltage, said output stage being selectively connected in said output circuit and disconnected from said output circuit by means of said transistors and of an enabling signal (TRISB) and a switching signal (TRISP), and delivering an output signal at an output point of said output stage, said output point corresponding to a common point between the enabling transistor and the P and N MOS transistors connected in parallel, first switching control means for controlling switching of said P-type MOS transistor, said first switching control means being connected to said input circuit for producing said variable logic level and receiving a logic level signal (INBUF) representing said variable logic level and said switching signal (TRISP), second switching control means for said N-type MOS transistor in series with the P and N MOS transistors connected in parallel, third switching control means for said first N-type MOS transistor, operating in a mode of feedback of the output voltage delivered by said output stage, said first and second switching control means being driven successively such as to generate an intermediate switching level at said high logic level so as to enhance the resultant time for switching between levels.

2. Circuit according to claim 1, wherein said first switching control means includes, connected in series:

a NOR circuit receiving, on switching control inputs thereof, said logic level signal (INBUF) and said enabling signal (TRISP) and for producing, responsive thereto, an intermediate switching pre-control signal (sel1P), and a circuit for receiving and shaping said intermediate switching pre-control signal (sel1P) and for producing a positive intermediate switching control signal (cmde1P) to the gate electrode of the said P-type MOS transistor.

3. Circuit according to claim 1, wherein the second switching control means for said enabling transistor, includes:

a NAND-type logic gate receiving a signal representing the said logic level signal (INBUF) and said enabling signal (TRISB), and delivering a corresponding logic signal, and a shaping stage receiving said corresponding logic signal and delivering a control signal for said enabling transistor.

4. Circuit according to claim 1, wherein said third switching control means includes:

a circuit for detecting the output voltage connected between the reference voltage and said output point of the output stage, and for delivering a detected signal, an inverter logic circuit for receiving the said detected signal and said logic level signal complemented by means of a NAND gate, said inverter logic circuit delivering a negative intermediate switching control signal (cmde1N) to the gate electrode of said first N-type MOS transistor.

* * * * *